United States Patent
Kondou

(10) Patent No.: US 7,521,962 B2
(45) Date of Patent: Apr. 21, 2009

(54) SEMICONDUCTOR INTEGRATED CIRCUIT APPARATUS

(75) Inventor: Keiichirou Kondou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 112 days.

(21) Appl. No.: 11/790,744

(22) Filed: Apr. 27, 2007

(65) Prior Publication Data

US 2008/0169835 A1 Jul. 17, 2008

(30) Foreign Application Priority Data

Apr. 27, 2006 (JP) ............... 2006-124223

(51) Int. Cl.
*H03K 19/173* (2006.01)
(52) U.S. Cl. .................. 326/41; 326/47; 326/101; 257/202; 716/12
(58) Field of Classification Search ............ 326/41, 326/47, 101; 716/1–3, 12; 257/202
See application file for complete search history.

(56) References Cited

U.S. PATENT DOCUMENTS

| 5,029,279 | A | 7/1991 | Sasaki et al. |
| 6,674,307 | B2 | 1/2004 | Mizuno |
| 7,191,424 | B2 * | 3/2007 | Dirks et al. .................. 716/12 |
| 7,404,154 | B1 * | 7/2008 | Venkatraman et al. ......... 716/2 |
| 2006/0048079 | A1 * | 3/2006 | Dirks et al. .................. 716/3 |
| 2006/0247875 | A1 * | 11/2006 | Ooshima ..................... 702/79 |

FOREIGN PATENT DOCUMENTS

| JP | 64-41326 | 2/1989 |
| JP | 2-29124 | 1/1990 |
| JP | 11-17014 | 1/1999 |
| JP | 2002-198801 | 7/2002 |
| JP | 3555080 | 5/2004 |

* cited by examiner

*Primary Examiner*—Vibol Tan
(74) *Attorney, Agent, or Firm*—Young & Thompson

(57) ABSTRACT

A semiconductor integrated circuit apparatus relates to a structured ASIC that wires functional cells in a common wiring layer, which is not dependent on a user circuit and common to several sorts, and a customized layer provided over the common wiring layer to form the user circuit. In the semiconductor integrated circuit apparatus, a functional cell constituting a sequential circuit such as a flip-flop and a functional cell constituting a combinational circuit are placed in matrix of column and row. Further, the functional cell constituting the sequential circuit is placed obliquely in the matrix.

18 Claims, 13 Drawing Sheets ns, is prepared as a combinational circuit to configure the sequential circuit by combining the combinational circuit, the circuit size increases as compared to the circuit designed for the sequential circuit, thereby reducing the capacity of the user circuit.

SEMICONDUCTOR INTEGRATED CIRCUIT APPARATUS

BACKGROUND OF THE INVENTION

1. Field of the Invention

The present invention relates to a semiconductor integrated circuit apparatus.

2. Description of Related Art

Conventionally various methods for developing a semiconductor integrated circuit apparatus have been proposed. Among those methods, there is a technique called structured ASIC (Application Specific Integrated Circuit). The structured ASIC has a common wiring layer and a customized layer. The common wiring layer is a wiring layer not dependent on a user circuit and common to several sorts. The customized layer is provided over the common wiring layer to form the user circuit. In the customized layer, the functional cell is wired to realize the user circuit. Note that the functional cell is a cell constituted of the common wiring layer and an underlying basic device layer (transistor layer).

As shown in Japanese Patent Publication No. 3555080, a circuit configured with changeable functions (general-purpose logic module or a general-purpose logic cell or the like) is used as a functional cell. Examples of such circuits include NAND, NOR, EXOR and EXNOR.

According to this technique, a mask to form the common wiring layer can be used in common, thus the development cost can be reduced. Further, regardless of a user request, the functional cell can be previously prepared in the common wiring layer. Therefore, layers from the basic device layer to the common wiring layer are prepared as a "foundation" to create the customized layer and layers above in response to a user request. Thus the development period can be shortened.

An example of a semiconductor integrated circuit apparatus constituted by the structured ASIC is described hereinafter in detail. FIG. 12 is a view showing a configuration example of a clock synchronous circuit. As shown in FIG. 12, a combinational circuit 2 constituting a desired logic is formed between flip-flops 1. Generally in a semiconductor integrated circuit apparatus, a circuit is constituted of a sequential circuit like the flip-flop 1 and the combinational circuit 2.

In a GA (Gate Array) that wires according to a user circuit, the sequential circuit such as the flip-flop 1 and combinational circuit 2 can be optimally configured using a common basic device layer formed by arranging same transistors.

On the other hand in the structured ASIC, if a functional cell configured with changeable functions is used for a sequential circuit such as the flip-flop 1 and also for the combinational circuit 2, the size of the circuit for the functional cell increases, thereby reducing the capacity of the user circuit.

Further, even if the functional cells with changeable functions is prepared as a combinational circuit to configure the sequential circuit by combining the combinational circuit, the circuit size increases as compared to the circuit designed for the sequential circuit, thereby reducing the capacity of the user circuit.

Accordingly the sequential circuit like the flip-flop 1 is generally prepared as a different functional cell from the functional cell for a combinational circuit.

With such background, in the structured ASIC, two kinds of functional cells are previously prepared; a functional cell constituting a sequential circuit including the flip-flop 1 and a functional cell constituting the combinational circuit 2 other than the sequential circuit.

FIG. 13 is a view showing an example of a conventional circuit arrangement disclosed in Japanese Unexamined Patent Application Publication No. 64-41326. As shown in FIG. 13, flip-flops (FF) 1 and programmable logic array (PLA) units 2 are placed side by side in the same rows in an internal circuit area (wiring area) of a substrate 5. The rows having the flip-flop 1 and programmable logic array (PLA) unit 2 are placed alternately in the row direction. Input/output units 3 are placed around the internal circuit area 4. The circuits disclosed in Japanese Unexamined Patent Application Publication No. 11-17014 and Japanese Unexamined Patent Application Publication No. 2-29124 has similar circuit arrangement. As disclosed therein, in a conventional semiconductor integrated circuit apparatus, the flip-flop 1 and combinational circuit 2 are placed in the same row or column.

As shown in FIG. 13, the PLA units 2 and flip-flops 1 are placed alternately, as in PLA unit 2-11, flip-flop 1-11, PLA unit 2-12, flip-flop 1-12 . . . flip-flop 101n. Accordingly as indicated with the right directed arrow in FIG. 13, with the signals passing in the right direction of the chip, detouring the lines in other columns is unlikely to be generated. However in relation to problems on the interface, lines may be wired in the upward direction, not right direction. In such case as indicated with the upward arrow in FIG. 13, lines are likely to be detoured in other rows as in PLA unit 2-m2, PLA unit 2-32, flip-flop 1-32, PLA unit 2-32, PLA unit 2-22, flip-flop 1-22, PLA unit 2-22 and PLA unit 2-12.

A case of providing a plurality of signal lines having the same functions such as a bus signal is shown in FIG. 14A. In this case, signals pass to the right direction via circuit including a combinational circuit 21. In such case, logical function of the flip-flop 1 and between the flip-flops 1 in each of the signal lines is configured in the same way. However there are cases that a signal line needs to bend in a right angle halfway. In such case as shown in FIG. 14B, signal lines positioned at the outer side are longer than signal lines positioned at the inner side. Specifically, depending on the position of the signal line, the length of the signal line varies, thereby generating a delay between a plurality of signal lines. Further as shown in FIG. 14B, in the portion P where signal lines bend upwards when viewed from the front, the signal lines are concentrated. Specifically, congested lines require countermeasures including detouring lines.

SUMMARY

According to an aspect of the present invention, there is provided a semiconductor integrated circuit apparatus wiring functional cells in a common layer, which is not dependent on a user circuit and common to several sorts, and a customized layer provided over the common layer to form the user circuit, the semiconductor integrated circuit apparatus comprising: an internal circuit area divided in a plurality of segments in matrix; a plurality of first functional cells for a sequential circuit disposed obliquely in the internal circuit area; a plurality of second functional cells for a circuit other than the sequential circuit placed in a part of the internal circuit area other than the part the first functional cells are placed, and to be wired with the first cell in the customized layer.

According to another aspect of the present invention, there is provided a semiconductor integrated circuit apparatus wiring functional cells in a common layer, which is not dependent on a user circuit and common to several sorts, and a customized layer provided over the common layer to form the user circuit, the semiconductor integrated circuit apparatus comprising: an internal circuit area divided in a plurality of segments in matrix; a plurality of first functional cells for a sequential circuit disposed in the internal circuit area; and a plurality of second functional cells for a circuit other than the sequential circuit placed in a part of the internal circuit area other than the part the first functional cells are placed; wherein the second functional cells are placed on top, bottom, left and right segments of the first functional cells.

The present invention eliminates the detouring lines and enables to wire along with the flow of signal processing.

BRIEF DESCRIPTION OF THE DRAWING

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the description that follows, terms referring directions are used assuming that the drawings are viewed from the front.

Figure 1:
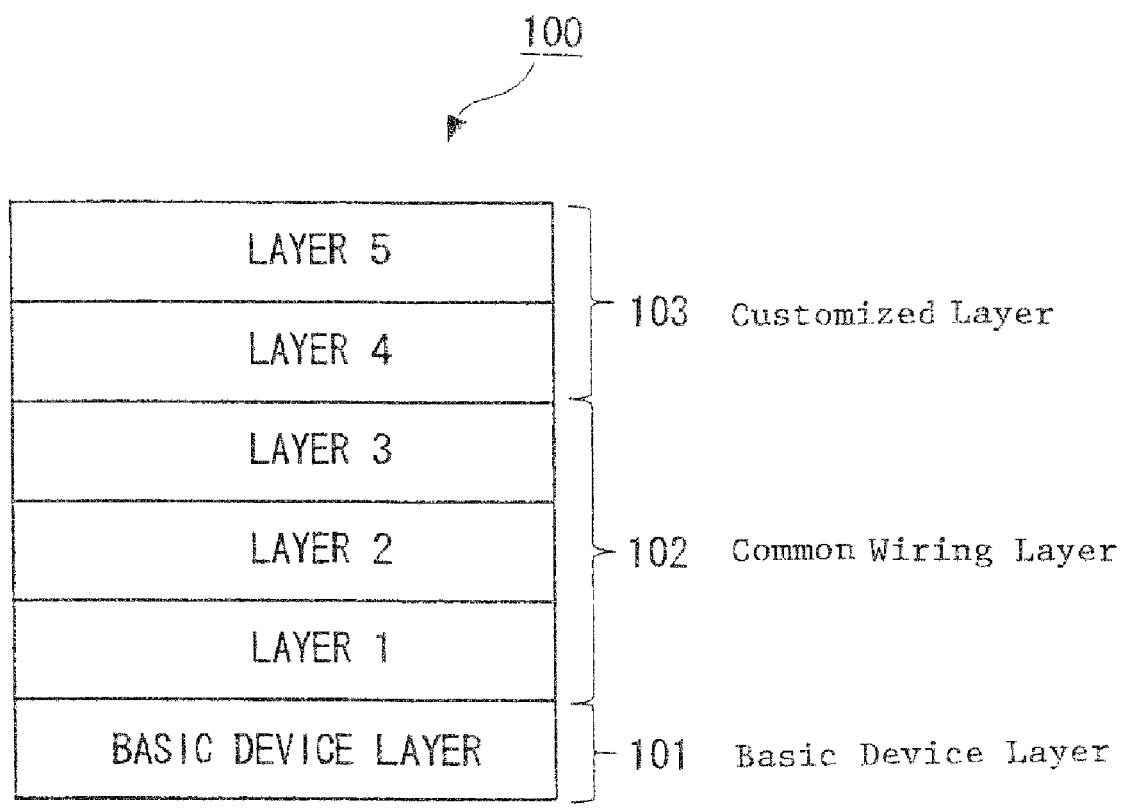
FIG. 1 is a cross-sectional schematic diagram illustrating the structure of a semiconductor integrated circuit apparatus according to an embodiment of the present invention.

FIG. 1 is a view showing a semiconductor integrated circuit apparatus (hereinafter referred merely to as a semiconductor apparatus) according to this embodiment. As shown in FIG. 1, a semiconductor apparatus 100 includes a basic device layer 101, common wiring layer 102 and customized layer 103 in this order. The semiconductor apparatus 100 is so called a structured ASIC. The structured ASIC is sometimes referred to as a platform ASIC.

The basic device layer 101 is a wiring layer positioned in a lower layer of the wiring layer. The basic device layer 101 is a transistor layer including basic devices such as transistor.

The common wiring layer 102 is a metal wiring layer common to several sorts. The common wiring layer 102 is formed by a common mask. Further the common wiring layer 102 is a wiring layer not dependent to a user circuit.

As shown in FIG. 1, the common wiring layer 102 is constituted of 1 to 3 layers in this example. A clock line, a power supply line and a test circuit or the like are formed by the common wiring layer 102. Here the basic device layer 101 and common wiring layer 102 are collectively referred to as a foundation layer. As the foundation layer does not depend on the user circuit, it can be previously designed.

In the internal circuit area, several functional cells are previously formed using the foundation layer (basic device layer 101 and common wiring layer 102). The functional cell is a general-purpose macro cell. A functional cell constituting a sequential circuit and a functional cell forming a circuit other than the sequential circuit are included in the functional cell. These functional cells are disposed in the internal circuit area in matrix (array) having columns and rows.

The sequential circuit is a logical circuit (for example a flip-flop, latch, shift register and counter) for determining an output value according to past input values, not only the current input value.

So-called general-purpose logic cell is included in the functional cell constituting the circuit other than the sequential circuit. Further, a combinational circuit is included in the circuit other than the sequential circuit. The combinational circuit is a logical circuit (for example NAND circuit, NOR circuit, INV circuit, AND circuit, OR circuit and selector circuit) for determining an output value only by the current input value.

The customized layer 103 is a metal wiring layer for constituting the user circuit. The customized layer 103 is formed using an individual mask. A functional cell node is formed over the top layer of the common wiring layer 102. The user circuit is formed by connecting these nodes alternatively in the customized layer. As shown in FIG. 1, the customized layer 103 is formed by 4 to 5 layers.

Figure 2:
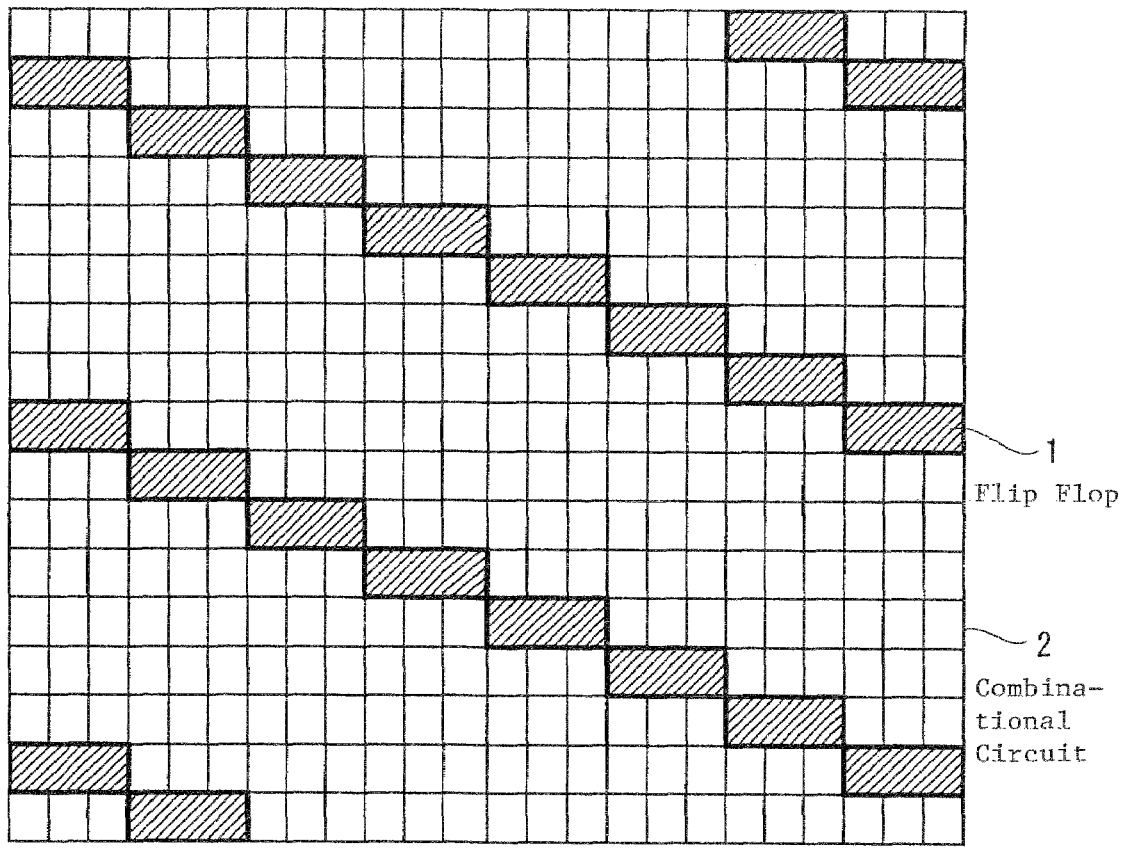
FIG. 2 is a view showing a configuration example of a functional cell in the semiconductor according to the embodiment of the present invention.

FIG. 2 is a view showing a configuration example of a functional cell constituting a flip-flop 1 and a functional cell constituting a combinational circuit 2. In the description that follows, the functional cell constituting the flip-flop 1 may be referred merely as the flip-flop 1. Likewise, the functional cell constituting the combinational circuit 2 may be referred merely as the combinational circuit 2.

As shown in FIG. 2, the internal circuit area is divided into several segments. In other words, the several segments are disposed in matrix in the internal circuit area. Note that one segment corresponds to one circuit As shown in FIG. 2, one combinational circuit 2 is disposed in one segment. Three segments are disposed in the flip-flop 1. This is because that the flip-flop 1 has a larger area to arrange as compared to the general combinational circuit 2.

As shown in FIG. 2, the functional cell is disposed in matrix in the internal circuit area. In other words, the plurality of functional cells are disposed in column and row directions.

As shown in FIG. 2, the flip-flops 1 are placed obliquely in the functional cells disposed in matrix. In other words, the flip-flop 1 is not placed in the same row as the flip-flop 1 next to the flip-flop 1. Here the flip-flop 1 is placed in one row below the row the next flip-flop 1 is placed.

The flip-flop 1 is not placed next to another flip-flop 1. A functional cell constituting the combinational circuit 2 except the flip-flop 1 is placed next to the flip-flop 1.

In FIG. 2, a series of flip-flops 1 placed obliquely are included. The plurality of flip-flops 1 are placed having predetermined intervals in the row direction. Further the series of flip-flops 1 are placed parallel to each other.

In FIG. 2, the series of flip-flops are placed from the left top to the right bottom. In a predetermined column having an internal circuit area, the flip-flops 1 are placed having predetermined intervals. In other words, the intervals between the flip-flops 1 in the column direction are identical. Likewise, in a predetermined row having an internal circuit area, the flip-flops 1 are placed having predetermined intervals. In other words, the intervals between the flip-flops 1 in the row direction are identical. With such configuration, it is possible to achieve a configuration with high versatility, capable of dealing with various user circuits.

Figure 3:
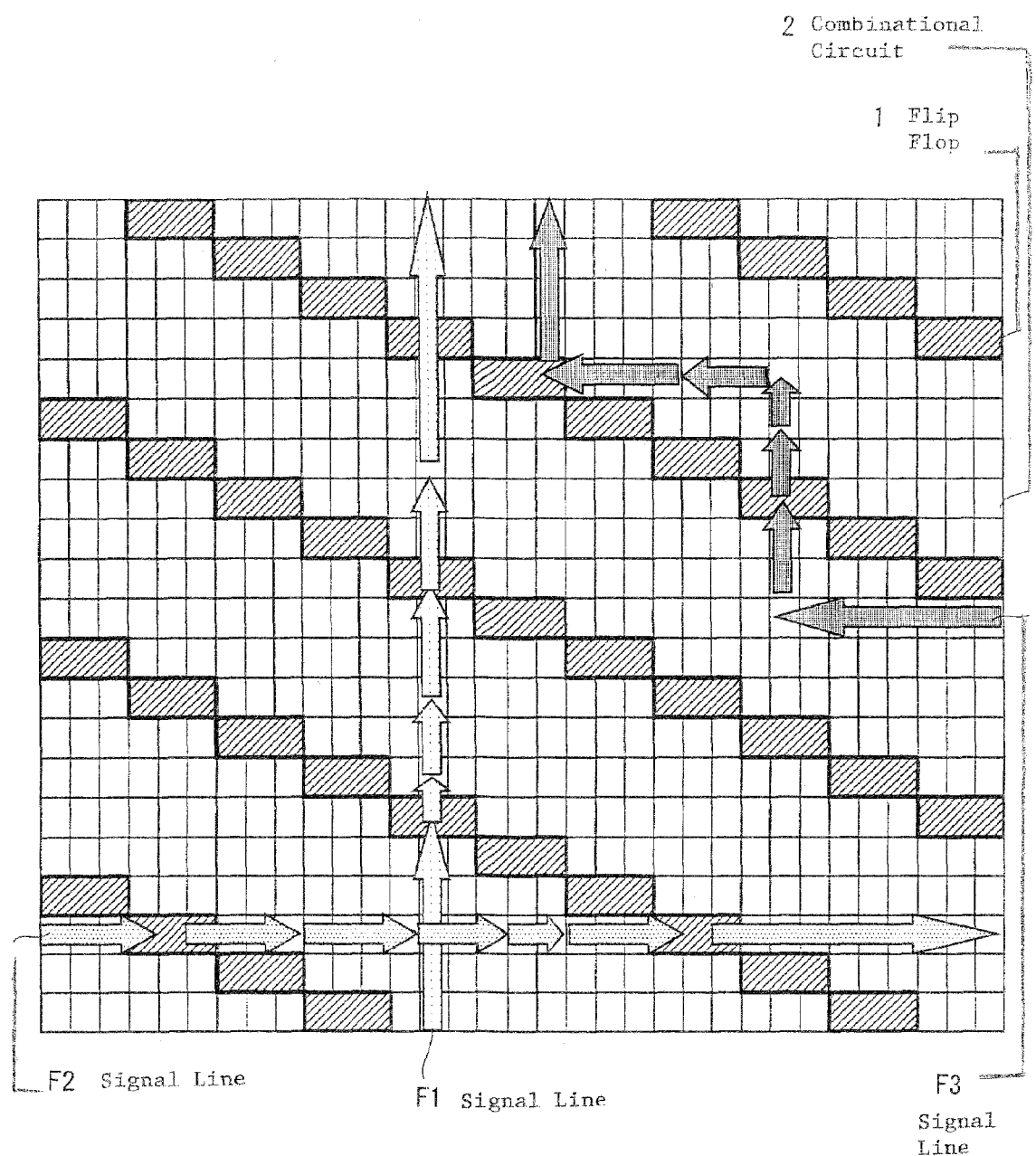
FIG. 3 is a view explaining an effect of the semiconductor integrated circuit apparatus according to the embodiment of the present invention.

An advantageous effect brought by this embodiment is described hereinafter in detail with reference to FIG. 3. According to the configuration of this embodiment, it is not necessary to detour lines but the signal lines can be wired according to the flow of signal processing, even when the direction of signal processing matches with the arrow F2 (horizontal direction) in addition to the arrow F1 (vertical direction). This is because that in this embodiment, the combinational circuit 2 is placed on the left, right, top and bottom (which is four directions) of the flip-flop 1. As detoured lines can be avoided, thus it is not necessary to secure space for the detoured lines. Thus enough wiring resource of the customized layer for realizing the user circuit can be secured. Thus it is possible to manufacture the structured ASIC with lower manufacturing cost in a shorter time.

In this embodiment, three combinational circuits 2 are placed over the flip-flop 1, and three combinational circuits 2 are placed below the flip-flop 1. Further, one combinational circuit 2 is placed on the right of the flip-flop 1, and three combinational circuits 2 are placed on the left of the flip-flop 1. That is, the configuration around the flip-flop 1 placed in the internal circuit area is identical in each of the plurality of flip-flops 1. With such configuration, in a case of forming the signal line (for example bus signal line) indicated by the arrow F3, the relation between the flip-flop 1 and combinational circuit 2 and the number of flip-flops 1 and combinational circuit 2 can be same as the plurality of signal lines. Specifically, as the flip-flop 1 is disposed on top, bottom, left and right, degree of freedom for wiring can be improved. For example even through the line length differs between the signal lines on inner and outer sides by the signal line being bend halfway, the line length of the signal lines can be set to be same consequently by bending the signal line to the opposite direction.

According to this embodiment, in the structured ASIC, user requests concerning the signal processing direction can be satisfied as well as the general versatility of the semiconductor apparatus can be improved.

Figure 4:
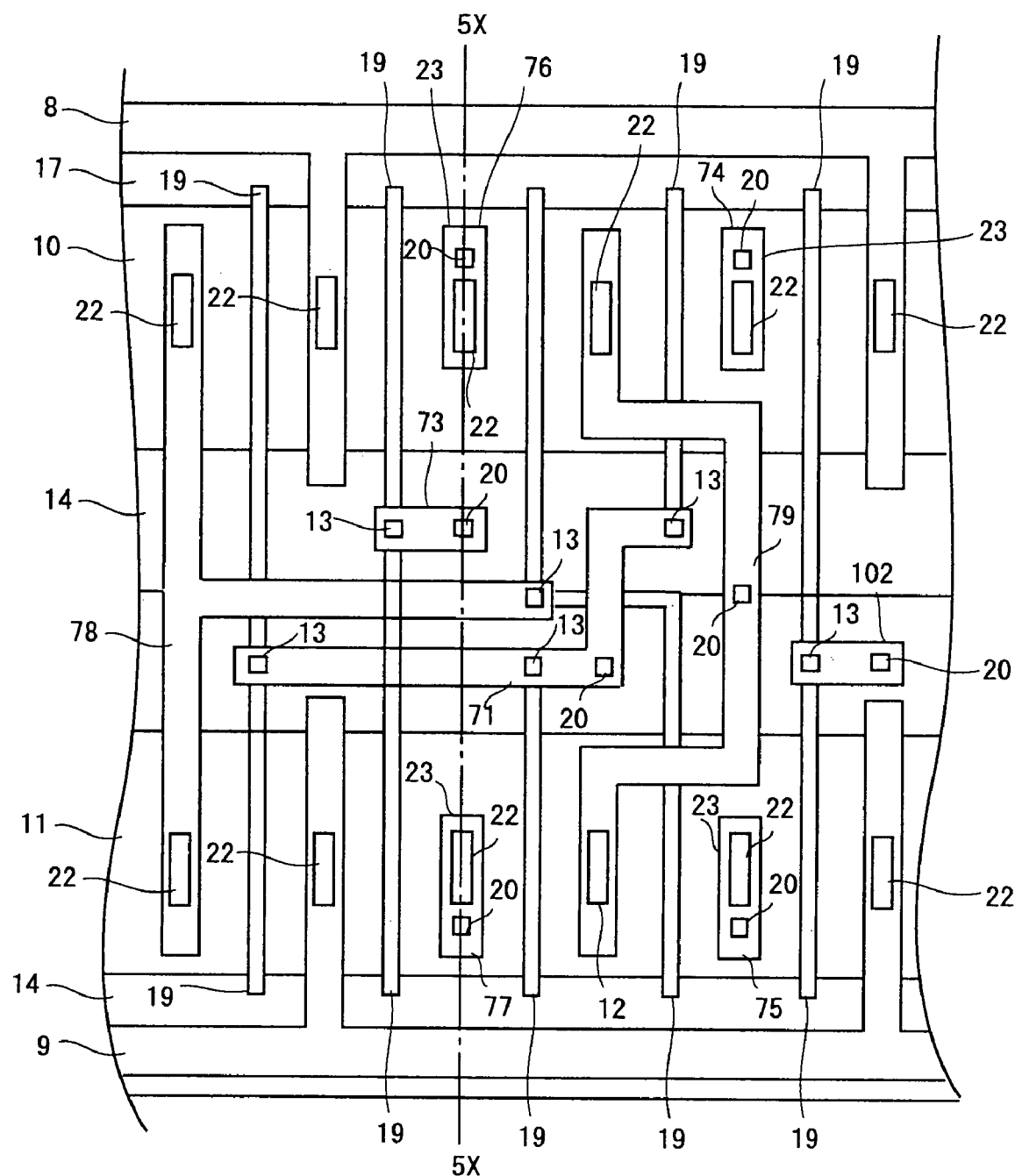
FIG. 4 is a plan view showing the configuration of the semiconductor integrated circuit apparatus according to the embodiment of the present invention.
Figure 5:
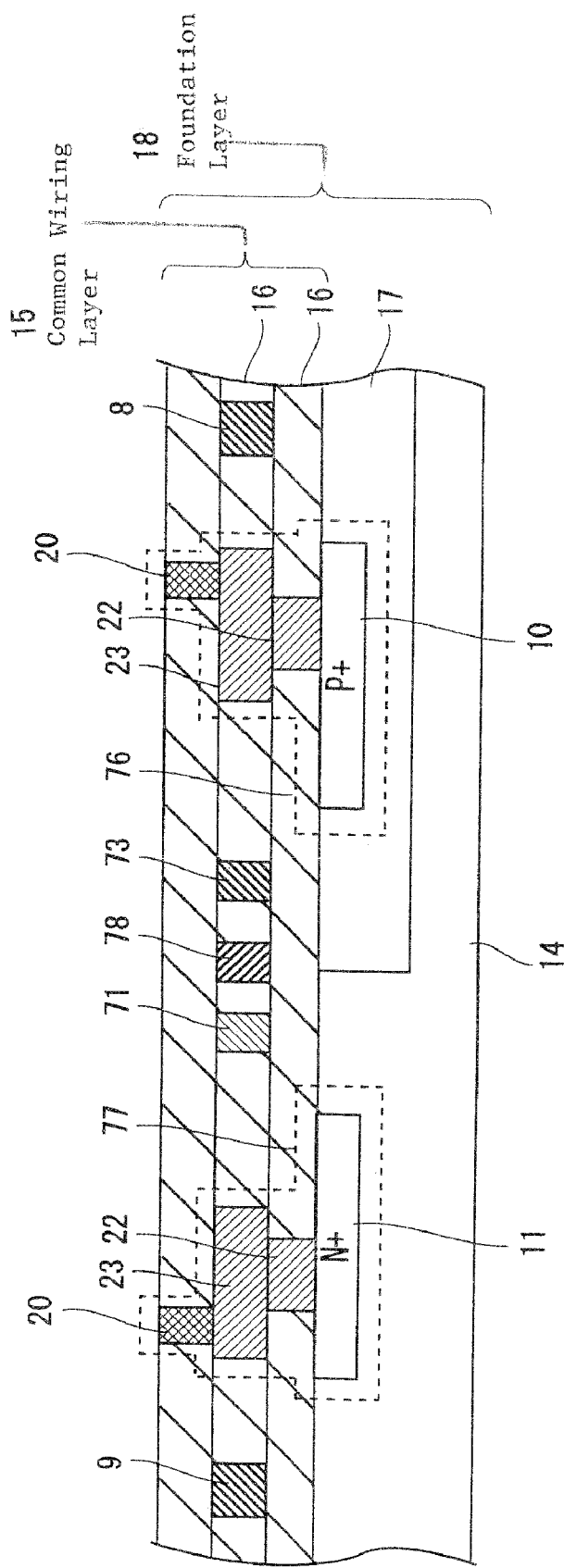
FIG. 5 is a cross-sectional diagram showing the configuration of the semiconductor integrated circuit apparatus according to the embodiment of the present invention.
Figure 6:
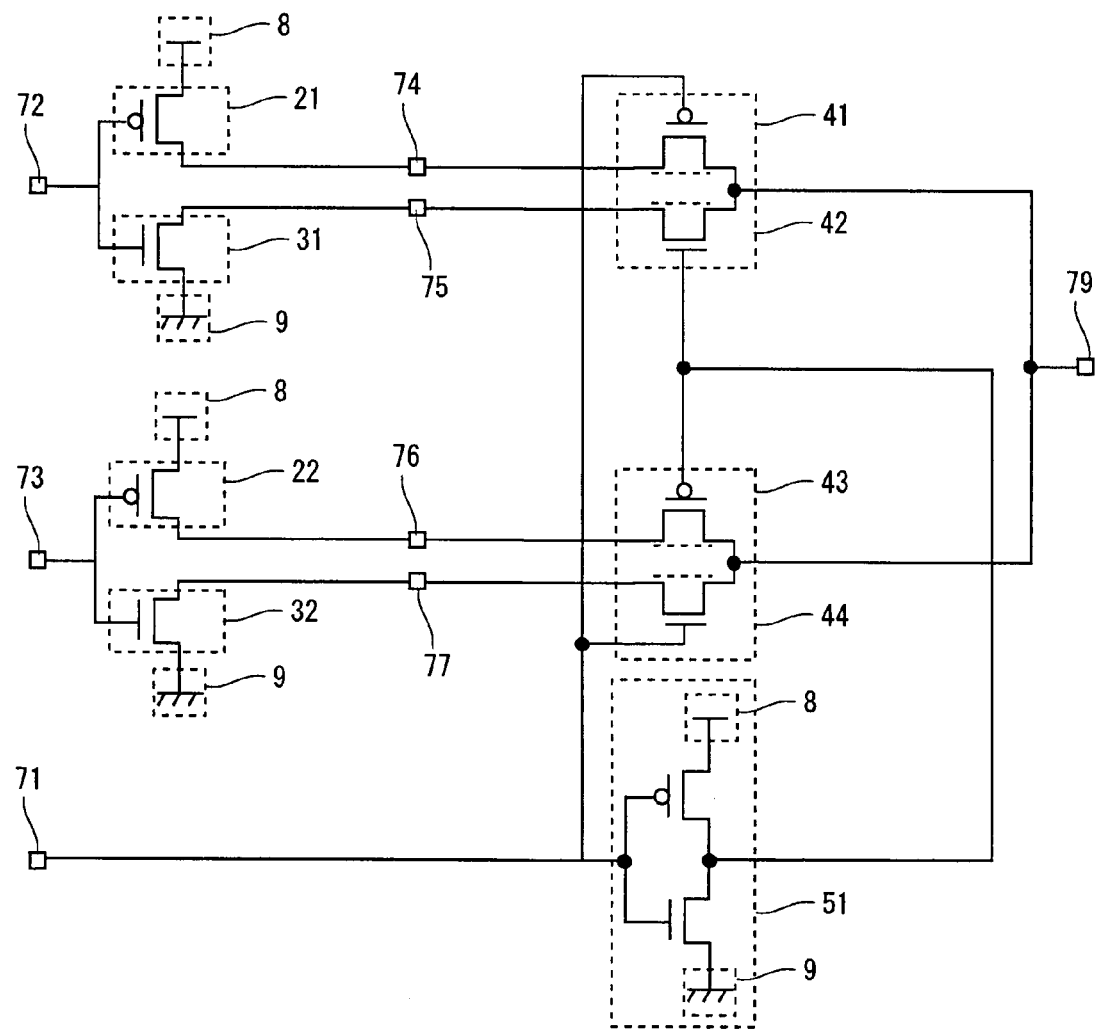
FIG. 6 is a circuit diagram showing a circuit example of the semiconductor integrated circuit apparatus according to the embodiment of the present invention.

FIGS. 4 and 5 are views showing configuration example of a semiconductor apparatus. FIG. 4 is a plan view showing an example of a functional cell mounted to the semiconductor apparatus. FIG. 5 is a cross-sectional diagram taken along the line 5X-5X of FIG. 4. FIG. 6 is a circuit diagram showing a circuit example of a semiconductor integrated circuit apparatus according to this embodiment. The semiconductor apparatus shown in FIGS. 4 and 5 has only a foundation layer in a previous phase of the customized layer being formed thereto. The semiconductors in FIGS. 4 and 5 is in a state that the common wiring layer is provided over the basic device layer.

As shown in FIG. 6, the functional cell in this embodiment is constituted of P type transistors 21, 22, 41 and 43, N type transistors 31, 32, 42 and 44 and an inverter 51. The logic of the functional cell can be changed by clamping a part or all of nodes 71 to 78. Likewise, the logic of the functional cell can be changed by connecting between the nodes 71 to 78. Similarly, the logic of the functional cell can be changed by combining the abovementioned clamp and the connection between the nodes.

As in the description that follows, the functional cell with changeable logic is formed in the foundation layer including the common wiring layer. As shown in FIG. 4, the nodes 71 to 78, an output terminal 79, power supply line 8, ground wire 9, gate contact 13, common wiring layer 15, gate poly silicon 19, via 20, contact 22 and line 23 over the substrate 14.

As shown in FIG. 5, an N type diffusion layer 11 and a P type diffusion layer 10 are formed in a substrate 14. The P type diffusion layer 10 is formed in an N well 17. An insulating film 16 is formed over the substrate 14. Further, the contact 22 connected with the line 23 is formed over the top surface of the N type diffusion layer 11 and P type diffusion layer 10. The nodes 71 to 78 are formed including the N type diffusion layer 11, contact 22 and line 23. Further, the nodes 71 to 78 may be formed including the P type diffusion layer 10, contact 22 and line 23.

The common wiring layer is the layer indicated by 15 as shown in FIG. 5. In the common wiring layer 15, the power supply line 8, ground wire 9, nodes 71 to 78, contact 22 and line 23 are formed. The nodes 71 to 78 are provided over the top layer of the common wiring layer 15. Further the nodes 71 to 78 are connected with a line provided in the customized layer. This changes the functional change to a desired logic. Only the nodes 71 to 78 necessary to constitute the user circuit are connected to the line of the customized layer. In other words, in the structured ASIC, extra nodes 71 to 78 that are not connected with the customized layer are provided in the common wiring layer 15.

The layer indicated by 18 is the foundation layer. In the customized layer, it is wired so that the functional cell is to be a desired logic. The user circuit can be realized by wiring between the functional cells. Note that the via 20 in FIGS. 4 and 5 can be removed.

Figure 7:
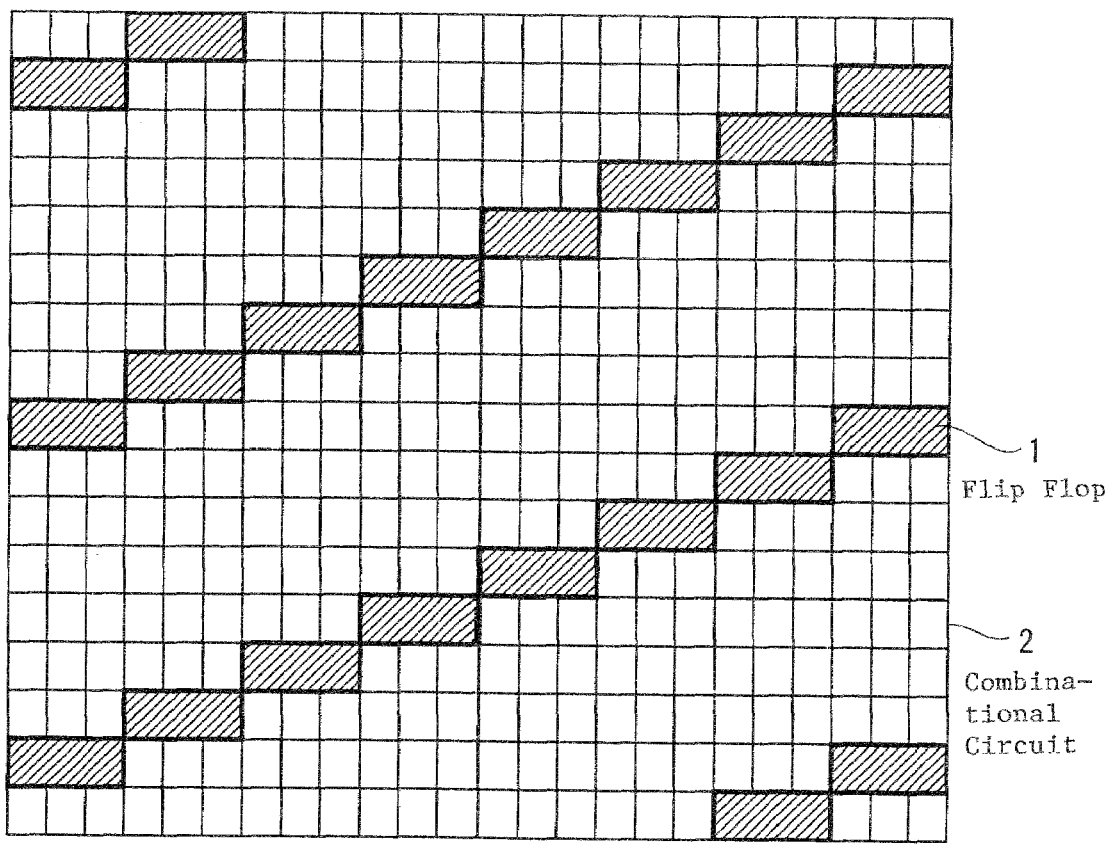
FIG. 7 is a view showing an arrangement example of a functional cell in the semiconductor integrated circuit apparatus according to the embodiment of the present invention.

In FIG. 2, the series of flip-flops 1 are consecutively placed from the right top to the left bottom. As shown in FIG. 7, the series of flip-flops 1 may be consecutively placed from the left bottom to the right top.

Figure 8:
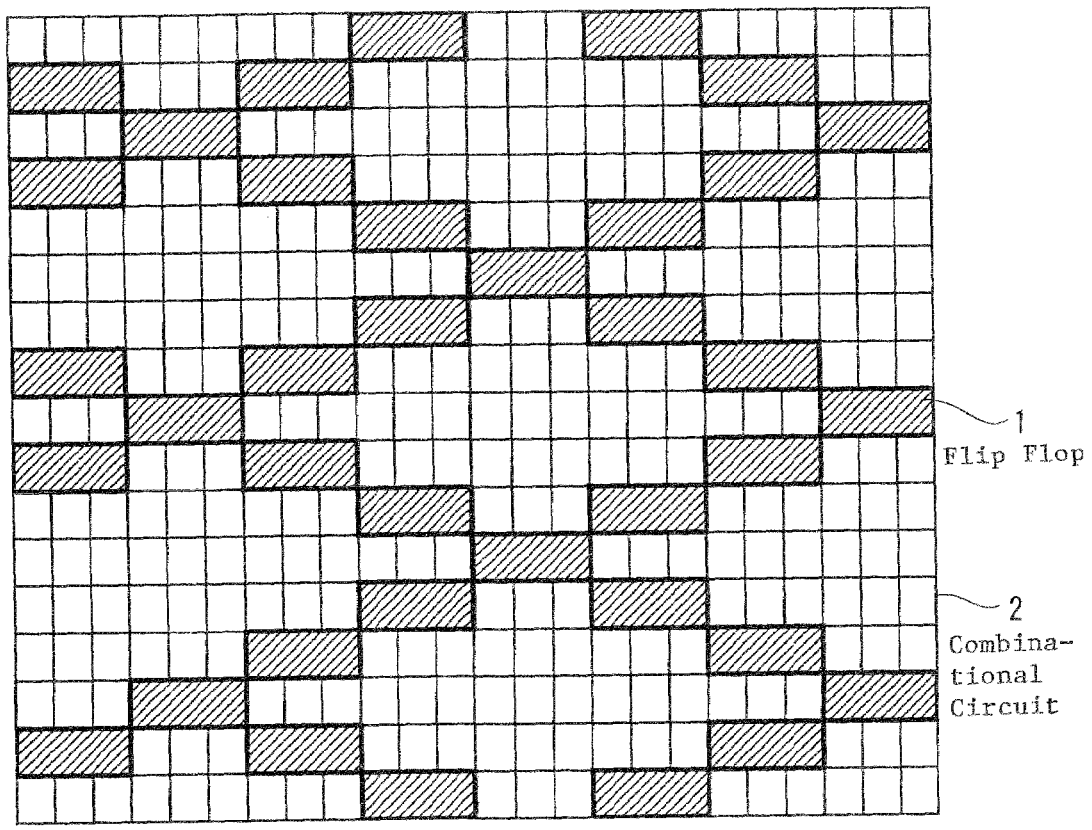
FIG. 8 is a view showing an arrangement example of a functional cell in the semiconductor integrated circuit apparatus according to the embodiment of the present invention.
Figure 9:
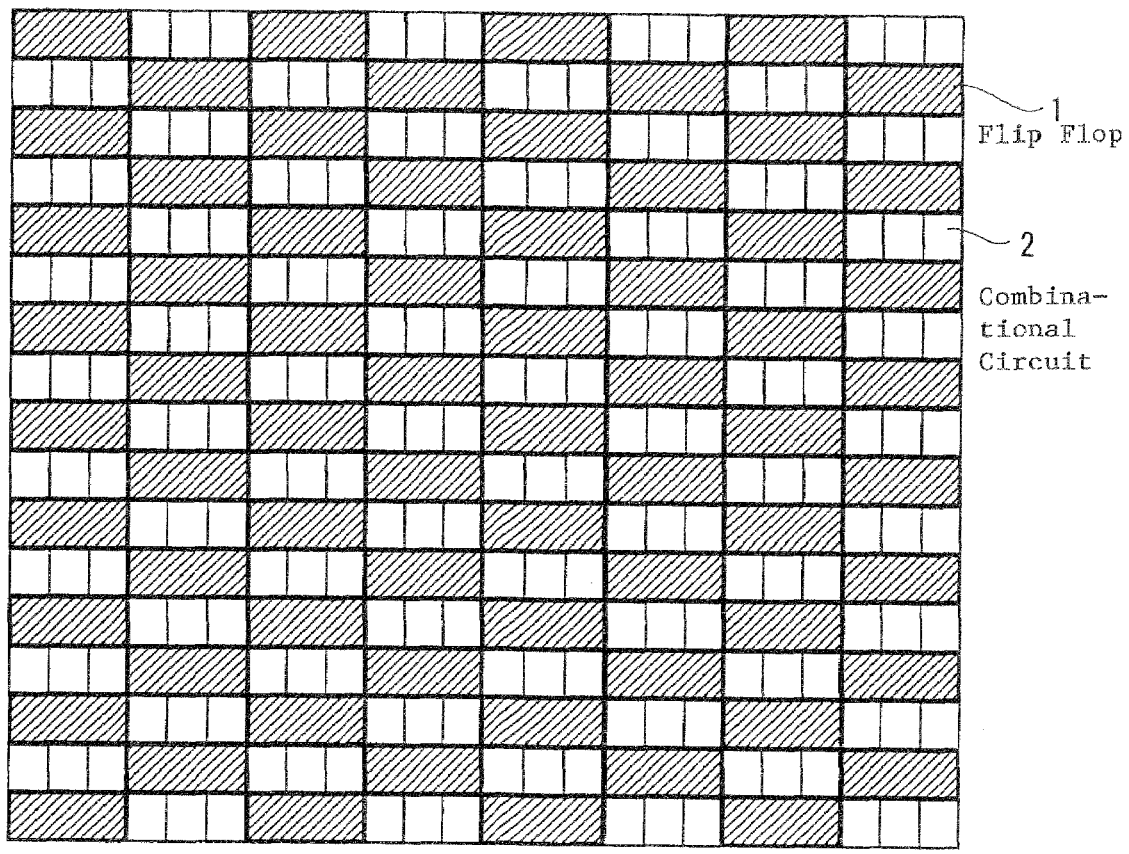
FIG. 9 is a view showing an arrangement example of a functional cell in the semiconductor integrated circuit apparatus according to the embodiment of the present invention.
Figure 10:
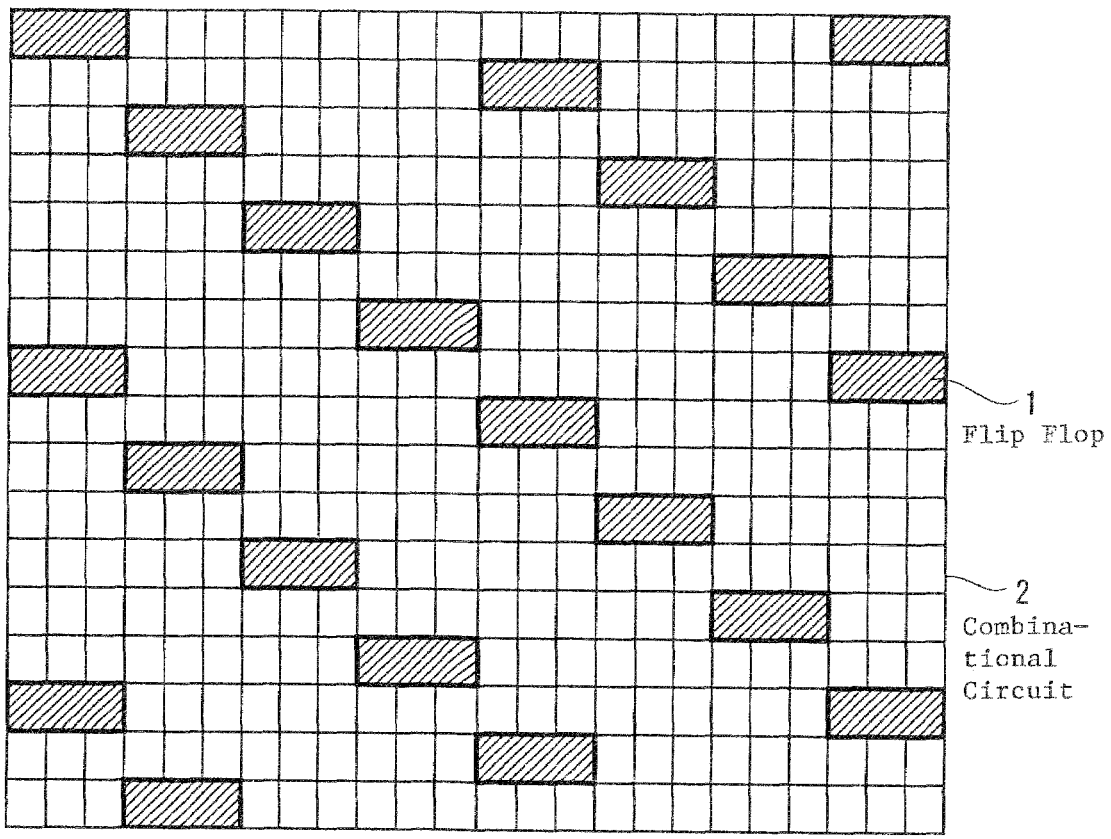
FIG. 10 is a view showing an arrangement example of a functional cell in the semiconductor integrated circuit apparatus according to the embodiment of the present invention.

Furthermore as shown in FIG. 8, together with the series of flip-flops 1 placed obliquely from the right top to the left bottom, the series of flip-flops 1 may be placed from the left top to the right bottom. That is, each of the series of flip-flops 1 may be placed in a way that they are orthogonal to each other. Further as shown in FIG. 9, the flip-flops 1 may be placed in houndstooth check. Further as shown in FIG. 10, the flip-flops 1 placed obliquely may be placed having predetermined intervals. In other words, the flip-flops placed obliquely need not to be placed consecutively. In the examples shown in FIGS. 2 and 7 to 10, the functional cell next to the flip-flop 1 in row direction is the combinational circuit 2, and not the flip-flop 1. Likewise, the functional cell next to the flip-flop 1 in column direction is the combinational circuit 2, and not the flip-flop 1.

The area having a sequential circuit such as a flip-flop or the like placed obliquely (area having combinational circuits, placed on the left, right, top and bottom of the sequential circuit) may be a part of the internal circuit area. It is not necessary to provide the area having a sequential circuit such as a flip-flop or the like obliquely over all the area of the internal circuit area.

Figure 11:
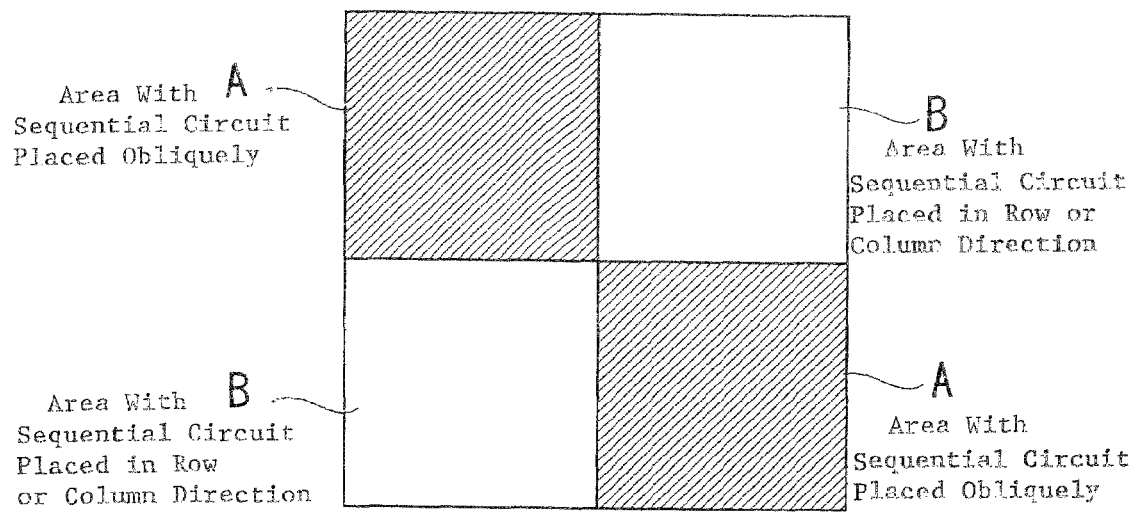
FIG. 11 is a view showing an arrangement example of a functional cell in the semiconductor integrated circuit apparatus according to the embodiment of the present invention.
Figure 12:
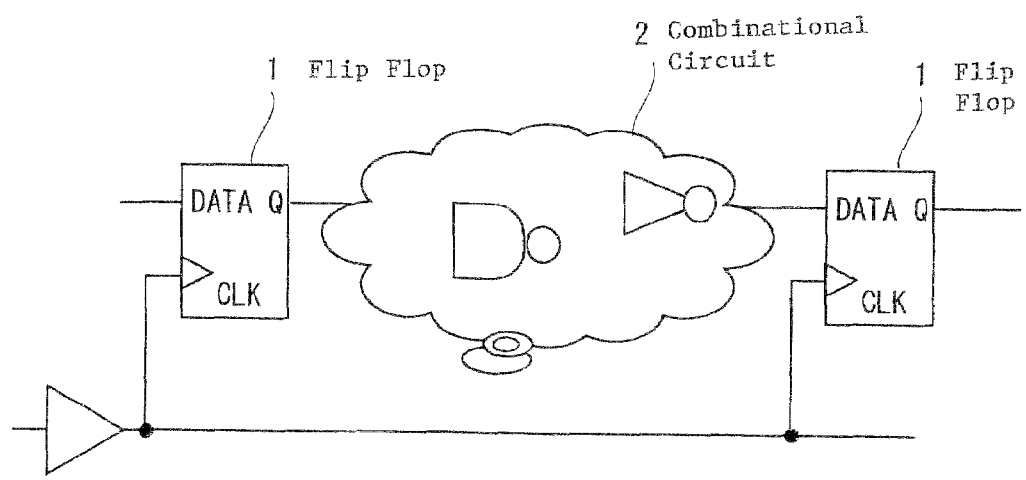
FIG. 12 is a circuit diagram showing a general clock synchronous circuit configuration.
Figure 13:
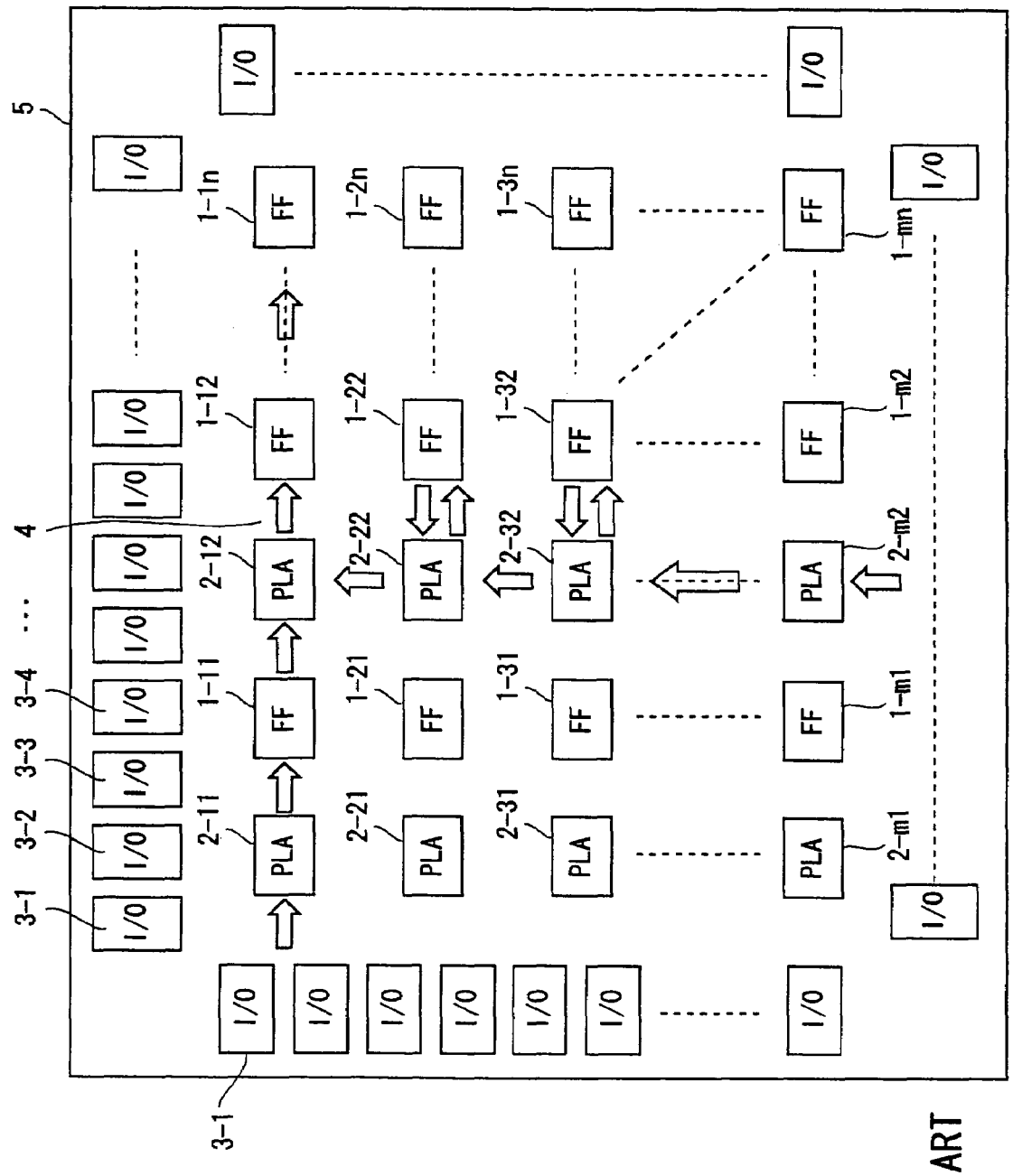
FIG. 13 is a view showing a configuration example of a functional cell in a conventional semiconductor integrated circuit apparatus.
Figure 14A:
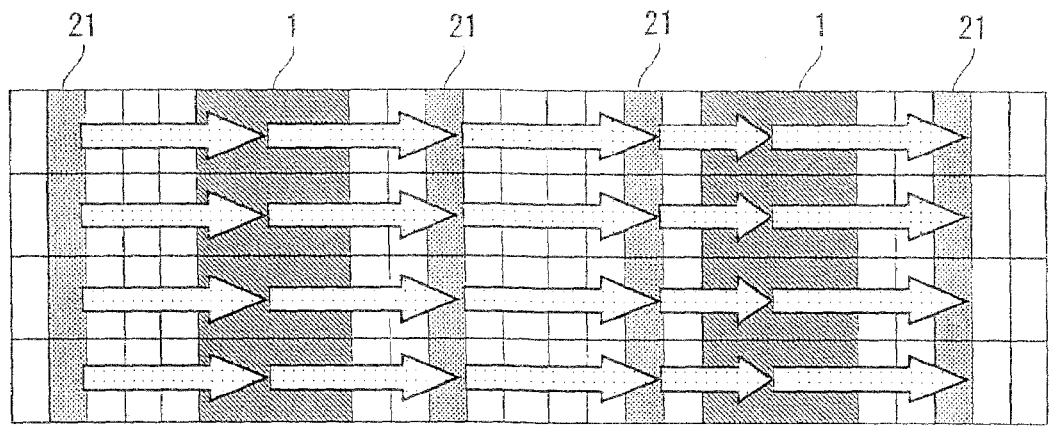
FIGS. 14A and 14B are views explaining problems in the conventional semiconductor integrated circuit apparatus.
Figure 14B:
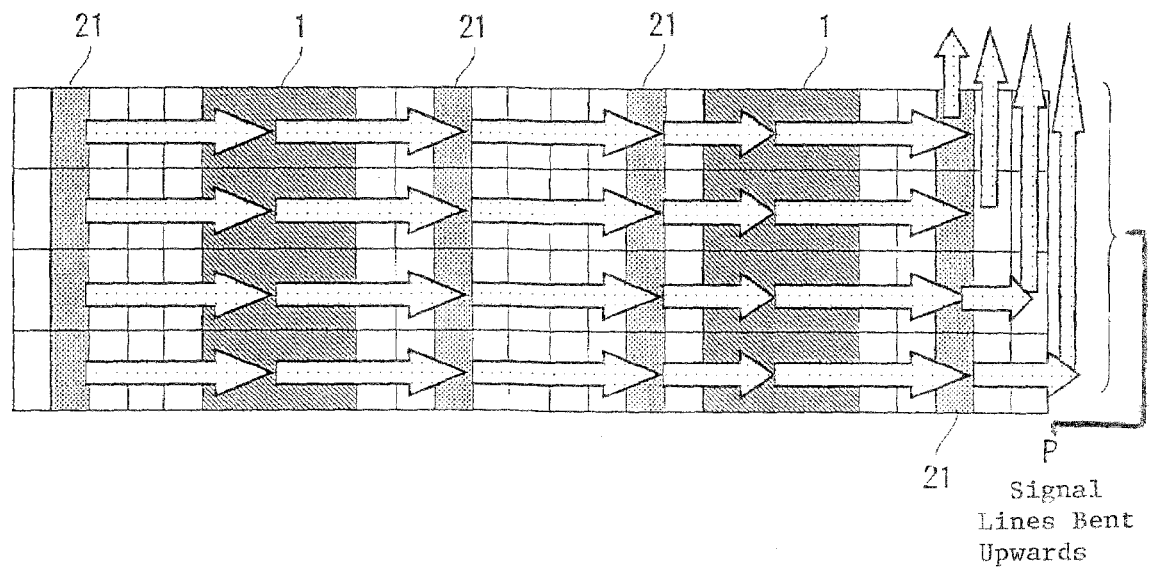

For example as shown in FIG. 11, the area A having a sequential circuit placed obliquely and an area B having a sequential circuit placed in row or column direction may be provided in the internal circuit area.

According to this semiconductor integrated circuit apparatus that has a common layer, which is not dependent on a user circuit and common to several sorts, and a customized layer provided over the common layer to form the user circuit, a plurality of first functional cells for a sequential circuit is disposed obliquely in an internal circuit area. So, in case of wiring in a right or left direction and upper or lower direction, detouring lines are eliminated and wiring along with the flow of signal processing is achieved. And also in case of bending a signal lines, such as a bus having a plurality of parallel lines, in a middle of the wiring, a relation between a sequential circuit and a region, where other circuits are to be placed in a upper or lower or right or left direction seeing from the sequential circuit in central, is set same even if a starting point of the wiring is set in any of the sequential circuits. So, a relation between sequential circuits and other circuits or a number thereof is set same configuration between signal lines.

According to this embodiment, a plurality of second functional cells for a circuit other than the sequential circuit are placed on top, bottom, left and right segments of the first functional cells for a sequential circuit, and same effect described above is achieved.

It is apparent that the present invention is not limited to the above embodiment and it may be modified and changed without departing from the scope and spirit of the invention.

What is claimed is:

1. A semiconductor integrated circuit apparatus wiring functional cells in a common layer, which is not dependent on a user circuit and common to several sorts, and a customized layer provided over the common layer to form the user circuit, the semiconductor integrated circuit apparatus comprising:
   an internal circuit area divided in a plurality of segments in matrix;
   a plurality of first functional cells for a sequential circuit disposed obliquely in the internal circuit area;
   a plurality of second functional cells for a circuit other than the sequential circuit placed in a part of the internal circuit area other than the part the first functional cells are placed, and to be wired with the first cell in the customized layer.

2. The semiconductor integrated circuit apparatus according to claim 1, wherein the second functional cells are placed on top, bottom, left and right segments of the first functional cells.

3. The semiconductor integrated circuit apparatus according to claim 1, wherein the first functional cells are placed next to each other.

4. The semiconductor integrated circuit apparatus according to claim 1, wherein the plurality of first functional cells are placed consecutively or intermittently in oblique.

5. The semiconductor integrated circuit apparatus according to claim 1,
   wherein the internal circuit area is polygon shape, and
   the plurality of first functional cells are placed in oblique along with a diagonal of the internal circuit area.

6. The semiconductor integrated circuit apparatus according to claim 1, wherein the plurality of first functional cells are placed having predetermined intervals in the same row of the internal circuit area.

7. The semiconductor integrated circuit apparatus according to claim 1, wherein the plurality of first functional cells are placed having predetermined intervals in a same column of the internal circuit area.

8. The semiconductor integrated circuit apparatus according to claim 1, wherein the sequential circuit is a flip-flop or a latch.

9. The semiconductor integrated circuit apparatus according to claim 1, wherein a general-purpose logic cell is included in the second functional cell.

10. The semiconductor integrated circuit apparatus according to claim 1, wherein the semiconductor integrated circuit apparatus is a structured ASIC.

11. A semiconductor integrated circuit apparatus wiring functional cells in a common layer, which is not dependent on a user circuit and common to several sorts, and a customized layer provided over the common layer to form the user circuit, the semiconductor integrated circuit apparatus comprising:
    an internal circuit area divided in a plurality of segments in matrix;
    a plurality of first functional cells for a sequential circuit disposed in the internal circuit area; and
    a plurality of second functional cells for a circuit other than the sequential circuit placed in a part of the internal circuit area other than the part the first functional cells are placed;
    wherein the second functional cells are placed on top, bottom, left and right segments of the first functional cells.

12. The semiconductor integrated circuit apparatus according to claim 11, wherein the plurality of first functional cells are placed in the internal circuit area obliquely.

13. The semiconductor integrated circuit apparatus according to claim 12, wherein the plurality of first functional cells are placed consecutively or intermittently in oblique.

14. The semiconductor integrated circuit apparatus according to claim 11, wherein the plurality of first functional cells are placed having predetermined intervals in a same row of the internal circuit area.

15. The semiconductor integrated circuit apparatus according to claim 11, wherein the plurality of first functional cells are placed having predetermined intervals in a same column of the internal circuit area.

16. The semiconductor integrated circuit apparatus according to claim 11, wherein the sequential circuit is a flip-flop or a latch.

17. The semiconductor integrated circuit apparatus according to claim 11, wherein a general-purpose logic cell is included in the second functional cell.

18. The semiconductor integrated circuit apparatus according to claim 11, wherein the semiconductor integrated circuit apparatus is a structured ASIC.

* * * * *